(12) United States Patent
Nakai (10) Patent No.: US 10,118,573 B2
(45) Date of Patent: *Nov. 6, 2018

(54) CONDUCTIVE MEMBER TO BE ROUTED IN A VEHICLE

(71) Applicant: Sumitomo Wiring Systems, Ltd., Yokkaichi, Mie (JP)

(72) Inventor: Hirokazu Nakai, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/568,674

(22) PCT Filed: Apr. 26, 2016

(86) PCT No.: PCT/JP2016/062977
§ 371 (c)(1),
(2) Date: Oct. 23, 2017

(87) PCT Pub. No.: WO2016/181818
PCT Pub. Date: Nov. 17, 2016

(65) Prior Publication Data
US 2018/0072247 A1    Mar. 15, 2018

(30) Foreign Application Priority Data
May 14, 2015 (JP) .................................. 2015-099024

(51) Int. Cl.
*H02G 3/34* (2006.01)
*B60R 16/02* (2006.01)
(Continued)

(52) U.S. Cl.
CPC ...... *B60R 16/0215* (2013.01); *B60R 16/0207* (2013.01); *H01B 7/20* (2013.01);
(Continued)

(58) Field of Classification Search
CPC .. B60R 16/0215; B60R 16/02; H02G 3/0481; H02G 3/0418; H02G 3/0487; H02G 3/04;
(Continued)

(56) References Cited

U.S. PATENT DOCUMENTS 4,394,533 A * 7/1983 Naito .................... B23K 11/364
156/50
4,583,065 A * 4/1986 Favre-Tissot .......... H01R 43/04
335/106
(Continued)

FOREIGN PATENT DOCUMENTS

JP    2009539207 A    11/2009
JP    2014022142 A    2/2014
(Continued)

OTHER PUBLICATIONS

International Search Report for Application No. PCT/JP2016/062977 dated May 31, 2016; 6 pages.

*Primary Examiner* — Michael F McAllister
(74) *Attorney, Agent, or Firm* — Reising Ethington, P.C.

(57) ABSTRACT

A conductive member to be routed in a vehicle includes a pipe member being tubular in shape and capable of keeping a shape, a core wire connected to an end portion of the pipe member and having flexibility, a connector terminal connected to an end portion of the core wire on a side that is opposite to the pipe member, and a corrugated tube covering the pipe member and the core wire and having flexibility.

4 Claims, 6 Drawing Sheets (51) Int. Cl.
*H01B 7/20* (2006.01)
*H02G 3/04* (2006.01)
*H05K 9/00* (2006.01)
*H01R 4/02* (2006.01)
*H01R 4/62* (2006.01)
*H02G 15/18* (2006.01)

(52) U.S. Cl.
CPC ............. *H02G 3/04* (2013.01); *H02G 3/0418* (2013.01); *H02G 3/0468* (2013.01); *H02G 3/0481* (2013.01); *H02G 3/0487* (2013.01); *H02G 3/34* (2013.01); *H05K 9/0098* (2013.01); *H01R 4/029* (2013.01); *H01R 4/625* (2013.01); *H02G 15/1806* (2013.01)

(58) Field of Classification Search
CPC .......... H02G 3/34; H05K 9/00; H05K 9/0098; H01B 7/20; H01R 4/029; H01R 4/625
USPC ....................................................... 174/72 A
See application file for complete search history.

(56) References Cited

U.S. PATENT DOCUMENTS

| | | | | |
|---|---|---|---|---|
| 5,971,819 | A * | 10/1999 | Prat | B64D 45/02 |
| | | | | 439/874 |
| 9,225,076 | B2 * | 12/2015 | Froeschl | H01R 4/023 |
| 9,780,460 | B2 * | 10/2017 | Koto | H01R 4/72 |
| 2003/0040215 | A1 * | 2/2003 | Kleen | H01R 4/70 |
| | | | | 439/510 |
| 2003/0236016 | A1 * | 12/2003 | Murakami | H01B 7/0081 |
| | | | | 439/212 |
| 2009/0249616 | A1 | 10/2009 | Fröschl | |
| 2015/0222103 | A1 | 8/2015 | Ina | |
| 2016/0268019 | A1 | 9/2016 | Kanagawa | |

FOREIGN PATENT DOCUMENTS

| | | |
|---|---|---|
| JP | 2014082909 A | 5/2014 |
| JP | 2014127297 A | 7/2014 |
| JP | 2015103457 A | 6/2015 |

* cited by examiner

CONDUCTIVE MEMBER TO BE ROUTED IN A VEHICLE

CROSS REFERENCE TO RELATED APPLICATIONS

This application claims the priority of Japanese patent application JP2015-099024 filed on May 14, 2015, the entire contents of which are incorporated herein.

Technical Field

The technology disclosed in this specification relates to a conductive member.

Background Art

Conventionally, as a wire harness to be routed in a vehicle, a wire harness disclosed in Patent Document 1 (JP 2014-82909A), for example, has been known. The wire harness disclosed in Patent Document 1 includes a pipe as a sheathing member. A conductor is inserted into the pipe, and thus, the shape of the conductor can be kept in a shape that conforms to the shape of a wiring route.

SUMMARY

In the above-described configuration, the pipe is required in order to keep the shape of the conductor when routed three-dimensionally. Thus, the number of components increases, and also the operation of inserting the conductor into the pipe is required, resulting in an increase in manufacturing costs.

A technology that is disclosed in this specification is a conductive member to be routed in a vehicle, the conductive member including at least one tube-shaped conductor being tubular in shape and capable of keeping a shape; a flexible conductor connected to an end portion of the tube-shaped conductor and having flexibility; a terminal connected to an end portion of the flexible conductor on a side that is opposite to the tube-shaped conductor; and a sheathing member covering the tube-shaped conductor and the flexible conductor and having flexibility.

According to the technology that is disclosed in this specification, the conductive member includes the tube-shaped conductor capable of keeping a shape. When a conductor is tube-shaped, compared with a conductor having a solid shape, the conductor can ensure rigidity while achieving a reduction in weight, and thus, the shape is easily kept. Moreover, the terminal and the tube-shaped conductor are coupled to each other via the flexible conductor having flexibility. Thus, it is possible to freely move the terminal by bending the flexible conductor, and the operation for attaching the terminal to other members can be easily performed. With the sheathing member having flexibility, the tube-shaped conductor and the flexible conductor can be protected. As per that described above, it is possible to keep the shape of a three-dimensionally routed conductor and protect the conductor without the need to use a pipe.

Moreover, the tube-shaped conductor can include a plurality of tube-shaped portions, and the conductive member can include a coupling member having flexibility and conductivity and coupling the plurality of tube-shaped portions. With this configuration, the tube-shaped conductor can be folded at the coupling member, which has flexibility, and thus, the conductive member can be carried with ease.

Moreover, it is possible to insert an end portion of the flexible conductor on the tube-shaped conductor side into the tube-shaped conductor. Disposing the end portion of the flexible conductor inside the tube-shaped conductor makes it possible to more reliably prevent a situation in which the end portion of the flexible conductor comes into contact with other members.

Moreover, the conductive member can include a plurality of the tube-shaped conductors; a shielding member covering at least the plurality of tube-shaped conductors and having flexibility; and an insulating layer interposed between the plurality of tube-shaped conductors and the shielding member. With the shielding member, the tube-shaped conductors can be electromagnetically shielded.

With the conductive member that is disclosed in this specification, it is possible to keep the shape of the conductive member without the need to use a pipe.

DESCRIPTION OF EMBODIMENTS

Embodiment 1

Embodiment 1 will be described with reference to the drawings in FIGS. 1 to 5. In the present embodiment, as a conductive member 10, for example, a conductive member to be routed under the floor of a vehicle is described by way of example. It is assumed that the conductive member 10 electrically connects a battery (not shown) disposed in a rear portion of the vehicle and a device (not shown) installed in an engine room that is provided in a front portion of the vehicle to each other.

Figure 1:
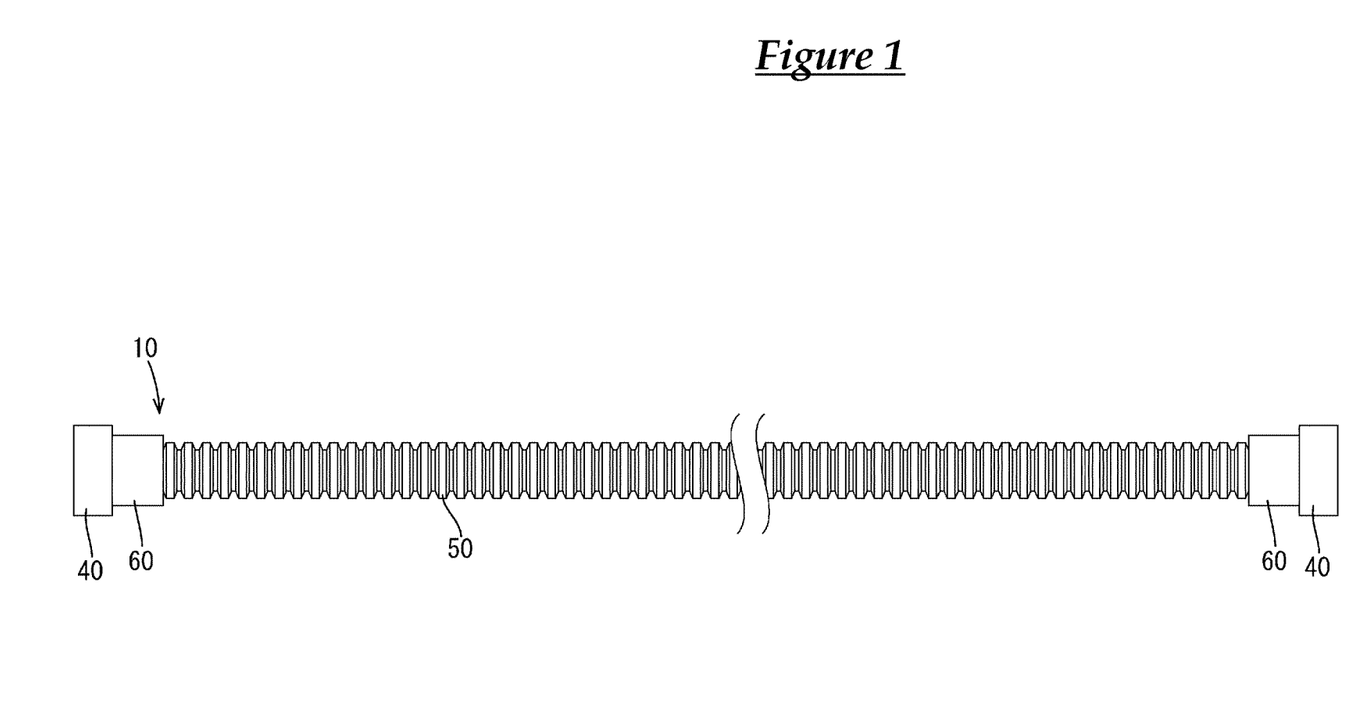
FIG. 1 is a diagram showing a conductive member of Embodiment 1.
Figure 2:
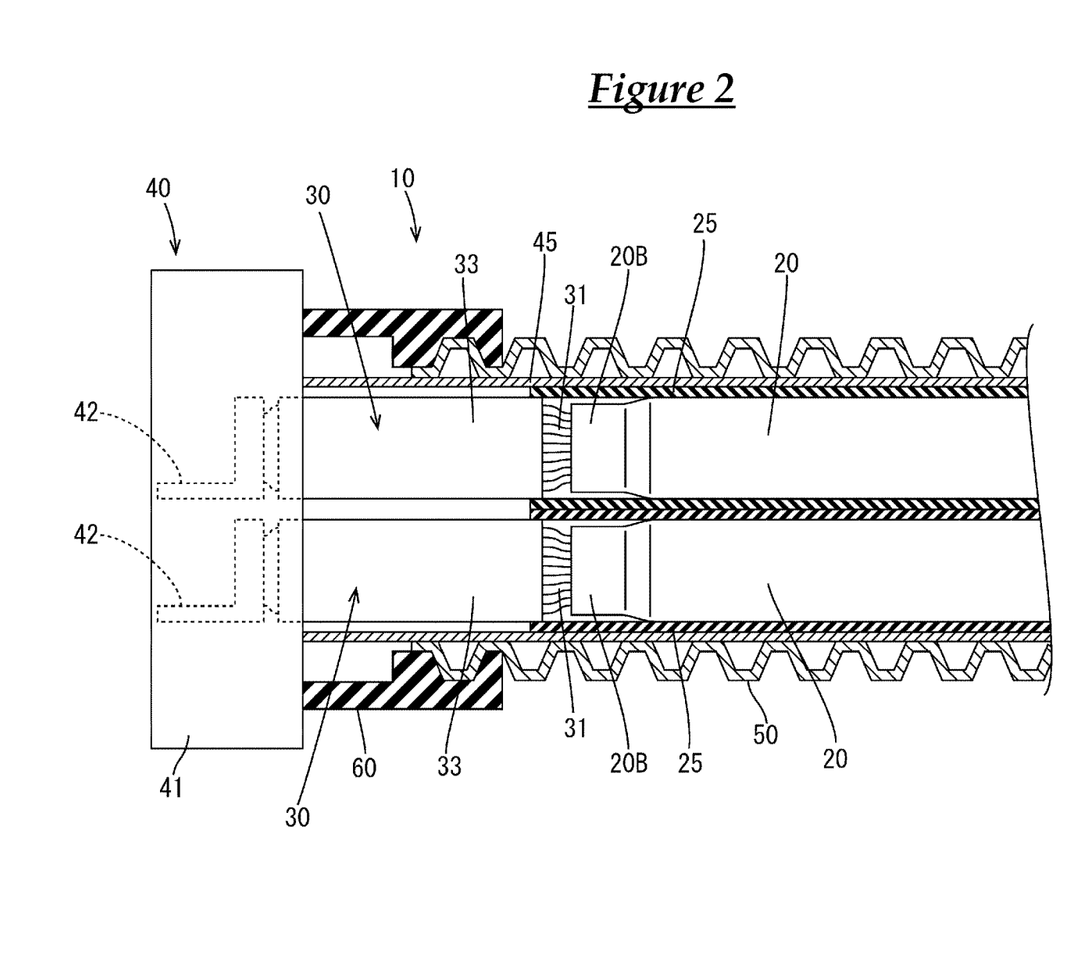
FIG. 2 is a diagram showing a pipe member and a coated wire.
Figure 3:
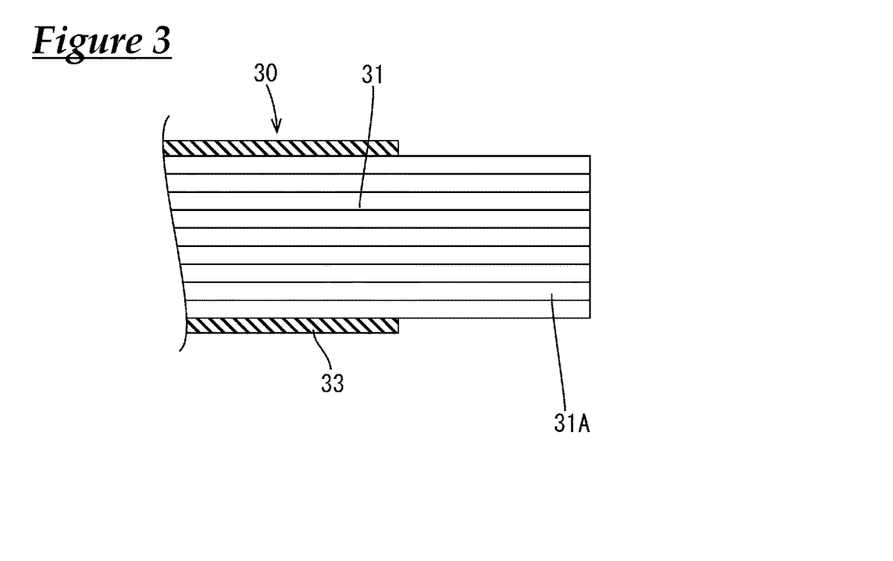
FIG. 3 is a cross-sectional view showing an end portion of the coated wire prior to being connected to the pipe member.
Figure 4:
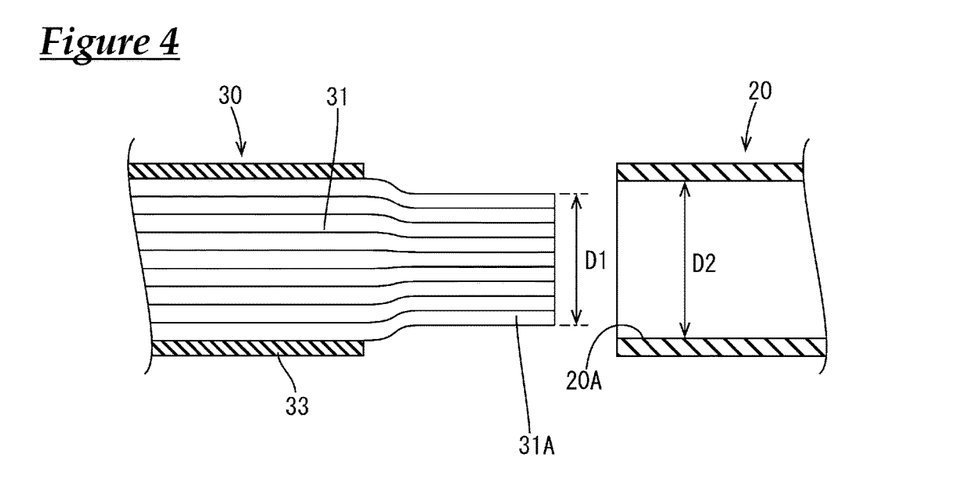
FIG. 4 is a cross-sectional view showing a state in which an end portion of a core wire is compressed.

As shown in FIGS. 1 and 2, the conductive member 10 includes a pipe member 20 (tube-shaped conductor), a pair of coated wires 30 respectively connected to both end portions of the pipe member 20 with respect to a longitudinal direction thereof, connectors 40 connected to end portions of the respective coated wires 30 on a side that is opposite to the pipe member 20, a braided wire 45 that covers the pipe member 20 and the coated wires 30, a corrugated tube 50 that covers the braided wire 45, and rubber members 60 that are provided on respective end portions of the corrugated tube 50. In the present embodiment, as shown in FIG. 2, a plurality of (two in the present embodiment) pipe members 20 are provided, and coated wires 30 are connected to respective end portions of the pipe members 20. Moreover, the braided wire 45 and the corrugated tube 50 are provided in such a manner as to collectively cover the plurality of pipe members 20 and the plurality of coated wires 30.

Figure 5:
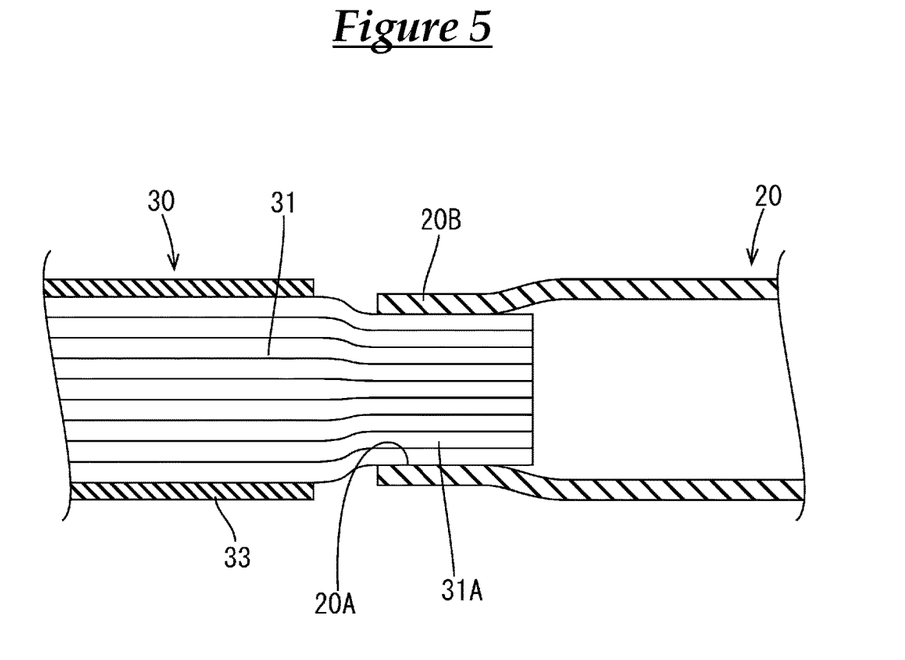
FIG. 5 is a cross-sectional view showing the coated wire in a state in which the coated wire is connected to the pipe member.

Each pipe member 20 is made of a metal having excellent conductivity, and has a cylindrical tubular shape as shown in FIG. 5. It should be noted that the cylindrical tube-shaped pipe member 20 can be formed by, for example, rolling up a metal plate. Moreover, for example, a metal tube may also be used as the pipe member 20. Here, any metal, such as aluminum, an aluminum alloy, copper, or a copper alloy, can be used for the pipe member 20 as necessary. Moreover, the pipe member 20 is rigid enough to keep its shape, and is shaped so as to conform to the shape of a wiring route of the conductive member 10 under the floor of the vehicle. It should be noted that, although FIG. 1 shows an example in which the pipe member 20 extends in a straight line, if the wiring route has a bent shape, the pipe member 20 may also be formed in a bent shape that conforms to the bent shape of the wiring route. The above-described pipe member 20 is hollow, and thus, has a superior moment of inertia of area compared with a solid member and has excellent shape-maintaining properties.

As shown in FIG. 5, each coated wire 30 includes a core wire 31 constituted by a plurality of elemental wires and an insulating coating 33 covering the core wire 31. The core wire 31 (linear flexible conductor) can be made using any metal, such as aluminum, an aluminum alloy, copper, or a copper alloy, as necessary and has flexibility (pliability). At an end of the coated wire 30, the insulating coating 33 is stripped, and the core wire 31 is exposed. An end portion 31A of the core wire 31 that is located on the pipe member 20 side is inserted into the pipe member 20 as shown in FIG. 5, and comes into contact with an inner circumferential surface 20A of the pipe member 20. On the other hand, an end portion of the core wire 31 that is located on the connector 40 side is connected to a connector terminal 42 (terminal, indicated by the dashed lines in FIG. 2) of the connector 40 as shown in FIG. 2.

The braided wire 45 (shielding member) is formed by braiding a plurality of thin metal elemental wires that have excellent conductivity into a netlike pattern and form a tubular shape having flexibility. As shown in FIG. 2, the braided wire 45 is configured to cover both the pipe members 20 and the coated wires 30 (core wires 31). Copper, copper alloys, aluminum, aluminum alloys, and the like can be used for the metal elemental wires that are used here, and in the present embodiment, a copper alloy is used, for example. The surface of the metal elemental wires is plated with tin, for example, and thus a tin-plated layer is formed thereon. The tin-plated layer suppresses oxidation of the metal elemental wires and the occurrence of rust. It should be noted that a configuration may also be adopted in which such a tin-plated layer is not formed.

Moreover, a heat-shrinkable tube 25 (insulating layer) is disposed between the braided wire 45 and each pipe member 20. The heat-shrinkable tube 25 surrounds an outer circumferential surface of the pipe member 20 and the exposed portions of the core wires 31. It should be noted that an end of the braided wire 45 may also be accommodated inside a housing 41 constituting a corresponding one of the connectors 40.

The corrugated tube 50 (sheathing member) is made of a synthetic resin, is formed into an accordion tubular shape having alternating ridges and grooves, and has flexibility. The corrugated tube 50 surrounds the pipe members 20 over the entire length thereof and portions of the coated wires 30 provided on the opposite sides of the pipe members 20. Each end portion of the corrugated tube 50 is disposed spaced apart from the corresponding connector 40, and the gap is closed by a waterproofing rubber member 60 (grommet). The rubber member 60 has a tubular shape, and one end portion thereof covers the end portion of the corrugated tube 50. Moreover, the other end portion (not shown) of the rubber member 60 is, for example, accommodated inside the housing 41 constituting the connector 40. It should be noted that a configuration may also be adopted in which the other end portion of the rubber member 60 externally covers an end portion of the housing 41.

Next, an example of a method for assembling the conductive member 10 will be described. First, the coated wires 30 to which the connectors 40 have been attached are connected to the respective end portions of the pipe members 20. Specifically, in each coated wire 30, the end portion 31A (see FIG. 3) of the exposed core wire 31 is compressed in a radial direction to make an outer diameter D1 of the end portion 31A slightly smaller than an inner diameter D2 of the corresponding pipe member 20 (see FIG. 4). Next, as shown in FIG. 5, the end portion 31A is inserted into the pipe member 20, and then an end portion 20B of the pipe member 20 is crimped onto the end portion 31A by being crimped around the entire circumference thereof using a hexagonal crimping tool, for example. Thus, the coated wire 30 is connected to the pipe member 20.

Subsequently, the heat-shrinkable tube 25 that has been mounted to the pipe member 20 in advance is heated and thereby heat-shrunk to come into intimate contact with the pipe member 20. Next, the coated wires 30 and the pipe members 20 are covered with the braided wire 45. Then, the braided wire 45 is covered with the corrugated tube 50, and the rubber members 60 are mounted to the corrugated tube 50. Thus, assembly of the conductive member 10 is completed.

Next, the effects of the present embodiment will be described. According to the present embodiment, the pipe members 20 capable of keeping their shapes are provided. Compared with solid pipe members, the tube-shaped pipe members 20 can ensure rigidity while achieving a reduction in weight, and easily keep their shapes. Also, the connectors 40 are coupled to the pipe members 20 via the coated wires 30 (core wires 31), which have flexibility. Thus, it is possible to freely move the connectors 40 by bending the coated wires 30, and thus the operation for attaching the connectors 40 to other members can be easily performed.

Moreover, with the braided wire 45, the pipe members 20 and the core wires 31 can be electromagnetically shielded. Furthermore, with the corrugated tube 50, the pipe members 20, the core wires 31, and the braided wire 45 can be protected. As per that described above, according to the present embodiment, it is possible to keep the shape of a conductor and shield and protect the conductor without the need to use a pipe serving as a sheathing member. It should be noted that the braided wire 45 and the corrugated tube 50 have flexibility, and therefore do not inhibit the bending of the coated wires 30.

Moreover, the end portion 31A of each core wire 31 is inserted into the corresponding pipe member 20. With this configuration, a situation in which the end portion 31A of the core wire 31 comes into contact with other members can be more reliably prevented. Moreover, the core wire 31 and the pipe member 20 can be connected to each other by inserting the end portion 31A of the core wire 31 into the pipe member 20 and crimping the end portion 20B of the pipe member 20 onto the end portion 31A in such a manner as to externally squeeze the end portion 20B. Thus, the need to provide a member for connecting the core wire 31 and the pipe member 20 to each other is eliminated, so that manufacturing costs can be reduced.

Moreover, according to the present embodiment, the end portion 31A of the core wire 31 is inserted into the pipe member 20 after the end portion 31A has been compressed in the radial direction. This configuration makes it possible to set the inner diameter of the pipe member 20 to a smaller value. Thus, the size of the pipe member 20 can be reduced, so that a reduction in weight can be achieved.

Moreover, with regard to the plate thickness of the pipe member 20, it is preferable to secure a certain degree of thickness in order to keep the shape of the pipe member 20. Provided that the plate thickness is constant, the larger the inner diameter of the pipe member 20, the larger the cross-sectional area of the pipe member 20. A situation in which the cross-sectional area of the pipe member 20 increases can be suppressed by reducing the inner diameter of the pipe member 20 even more. Thus, the value of the cross-sectional area of the core wire 31 and the value of the cross-sectional area of the pipe member 20 can be brought closer to each other, and therefore, the electrical resistance of the core wire 31 and the electrical resistance of the pipe member 20 can be made to be even closer to each other.

Embodiment 2

Figure 6:
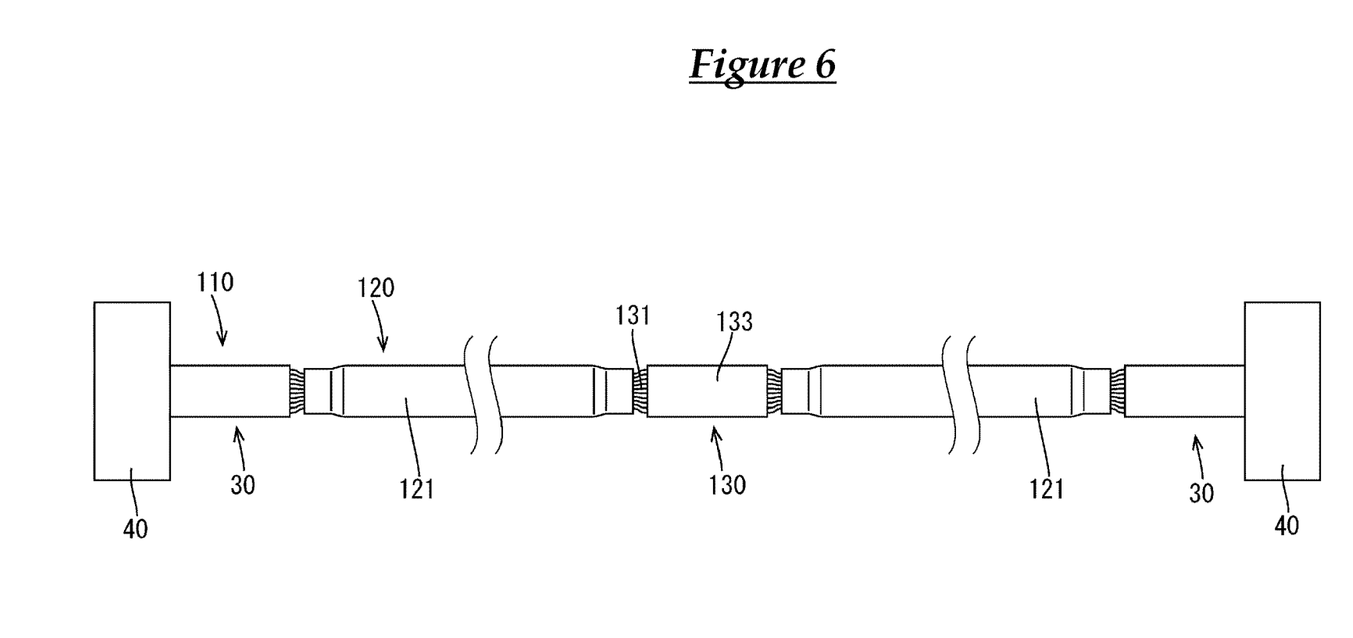
FIG. 6 is a diagram showing a coated wire and a pipe member constituting a conductive member of Embodiment 2.

Next, Embodiment 2 will be described with reference to the drawing in FIG. 6. In the present embodiment, the configuration of the pipe member differs from that of the above-described embodiment. It should be noted that the same portions as those of the above-described embodiment are denoted by the same reference numerals, and their redundant description is omitted. In a conductive member 110 of the present embodiment, as shown in FIG. 6, a pipe member 120 is constituted by a plurality of (two in FIG. 6) tube-shaped portions 121. It should be noted that members other than the connectors 40, the pipe member 120, and the coated wires 30 and 130 are omitted from FIG. 6.

Adjacent end portions of the plurality of tube-shaped portions 121 are coupled to each other by a coated wire 130 (coupling member) having flexibility. The coated wire 130 includes a core wire 131 having conductivity and an insulating coating 133 that covers the core wire 131. End portions of the core wire 131 are inserted into the respective tube-shaped portions 121. The tube-shaped portions 121 are crimped onto the core wire 131 by squeezing the end portions of the tube-shaped portions 121 after the end portions of the core wire 131 have been inserted into the respective tube-shaped portions 121. With the configuration in which the plurality of tube-shaped portions 121 are coupled to each other by the coated wire 130, the pipe member 120 can be folded at the coated wire 130, which has flexibility, and therefore, the conductive member can be carried with ease.

Embodiment 3

Next, Embodiment 3 will be described with reference to FIG. 7.

A conductive member 310 of the Embodiment 3 is a modification in which the shape of the two end portions of the pipe member 20 of Embodiment 1 has been changed, and a description of constituent elements and effects that the present embodiment has in common with Embodiment 1 is omitted to avoid redundancy. Moreover, the same constituent elements as those of Embodiment 1 are indicated using the same reference numerals.

Figure 7:
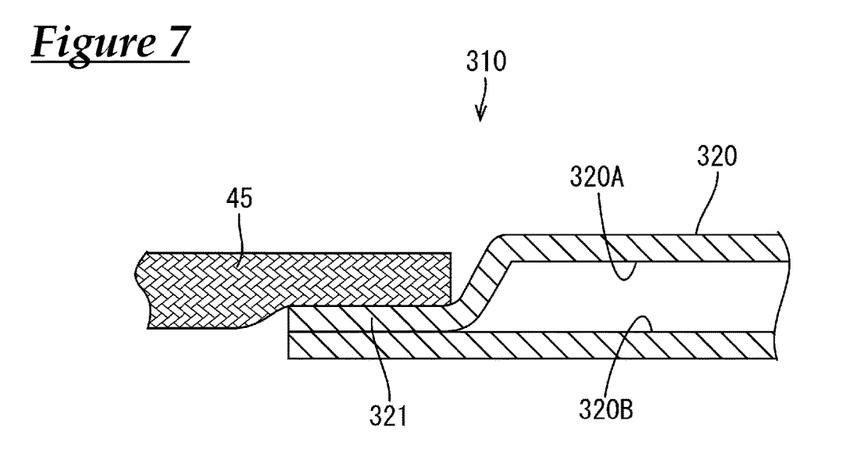
FIG. 7 is an enlarged cross-sectional view of a conductive member according to Embodiment 3, and shows a cross section of a crimp connecting portion in an enlarged manner.

As shown in FIG. 7, a flattened portion 321 to which a braided wire 45 has been welded and is connected thereto is provided at each of the two end portions of a pipe member 320 of Embodiment 3. The flattened portion 321 is formed by flattening the pipe member 320 in such a manner as to bring an upper end inner circumferential surface 320A of the pipe member 320 into contact with a lower end inner circumferential surface 320B thereof. Accordingly, the flattened portion 321 has the form in which an opening of the pipe member 320 is closed in a state in which it is wider than a middle portion (portion having a substantially cylindrical tubular shape) of the pipe member 320.

Moreover, at the flattened portion 321, the flattened portion 321 and the braided wire 45 are electrically connected to each other by performing ultrasonic welding in a state in which the braided wire 45 is placed on the flattened portion 321.

Embodiment 4

Next, Embodiment 4 will be described with reference to FIG. 8.

A conductive member 410 of Embodiment 4 is a modification in which the shape of the two end portions of the pipe member 20 of Embodiment 1 has been changed, and a description of constituent elements and effects that the present embodiment has in common with Embodiment 1 is omitted to avoid redundancy. Moreover, the same constituent elements as those of Embodiment 1 are indicated using the same reference numerals.

Figure 8:
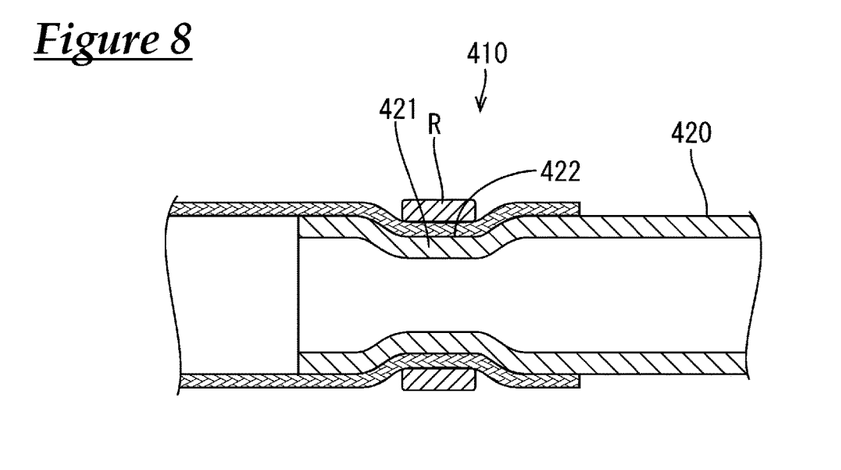
FIG. 8 is an enlarged cross-sectional view of a conductive member according to Embodiment 4, and shows a cross-section of a crimp connecting portion in an enlarged manner.

As shown in FIG. 8, a crimp connecting portion 421 to which a braided wire 45 is fixed through crimping is provided at each of the two end portions of a pipe member 420 of Embodiment 4.

At the crimp connecting portion 421, in a state in which the crimp connecting portion 421 is covered with the braided wire 45 in a tubular shape, a metal crimp ring (annular member) R externally fitted to the outer side of the braided wire 45 is fixed through crimping. As a result of the crimp ring R being fixed through crimping, the crimp connecting portion 421 and the braided wire 45 are fixed and electrically connected to each other.

Moreover, at the crimp connecting portion 421, while fixing the crimp ring R through crimping, the crimp connecting portion 421 is pressed inward, and thus, a groove portion 422 is provided, where an outer circumferential surface of the crimp connecting portion 421 is recessed inward over the entire circumference, while an inner circumferential surface thereof protrudes inward, and the inner diameter is reduced accordingly.

That is to say, according to the present embodiment, as a result of the crimp ring R fitting into the groove portion 422 in the outer circumferential surface of the crimp connecting portion 421, displacement of the crimp ring R in a front-rear direction is suppressed, so that the connection stability between the crimp connecting portion 421 and the braided wire 45 is ensured.

Other Embodiments

The technology disclosed in this specification is not limited to the embodiments that are described above using the drawings. For example, embodiments such as those described below are also embraced therein.

The number of pipe members and the number of coated wires are not limited to those described in the foregoing embodiments by way of example, and can be changed as appropriate.

In the foregoing embodiments, a connector terminal accommodated in the housing is taken as an example of the terminal; however, the present invention is not limited to this. For example, a round terminal or the like may also be used as the terminal.

The method for connecting the core wire and the pipe member to each other is not limited to the methods described in the foregoing embodiments by way of example. For example, the core wire and the pipe member may also be connected to each other by using ultrasonic welding or the like.

In the foregoing embodiments, a heat-shrinkable tube is taken as an example of the insulating layer that covers the pipe member; however, the present invention is not limited to this. For example, the insulating layer may also be formed by anodizing the pipe member or applying an insulating resin to the pipe member.

In the foregoing embodiments, a corrugated tube is taken as an example of the sheathing member having flexibility; however, the present invention is not limited to this. A rubber tube having flexibility or the like may also be used as the sheathing member.

In the foregoing embodiments, a braided wire is taken as an example of the shielding member having flexibility; however, the present invention is not limited to this. For example, a metal foil made of copper, a copper alloy, aluminum, an aluminum alloy, or the like may also be used as the shielding member.

In the foregoing embodiments, a core wire of a coated wire is taken as an example of the flexible conductor; however, the present invention is not limited to this. For example, a braided wire may also be taken as an example of the flexible conductor, and in this case, a heat-shrinkable tube, for example, may also be used as the insulating layer that covers the flexible conductor.

In Embodiment 2 described above, the pipe member may also be constituted by three or more tube-shaped portions.

The shape of the pipe member is not limited to a cylindrical tubular shape. For example, the pipe member may also have a rectangular tubular shape.

In the foregoing embodiments, a conductive member to be routed under the floor of a vehicle is taken as an example of the conductive member; however, the present invention is not limited to this. The conductive member disclosed in this specification is widely applicable to wiring sections where it is necessary to keep the shape thereof, between at least two electrical devices that are electrically connected to each other.

In the foregoing embodiments, a hollow cylindrical tube-shaped pipe member made of a metal having excellent conductivity is taken as an example of the pipe member; however, the present invention is not limited to this. It is sufficient if the pipe member has excellent conductivity, and, for example, a hollow cylindrical tube-shaped member made of a conductive resin may also be adopted. Moreover, a cylindrical tube-shaped member having a multilayer structure constituted by a resin layer and a metal layer may also be adopted as the pipe member.

Although omitted from the foregoing embodiments, a spacer may also be interposed between two pipe members that are disposed in the corrugated tube, and the positional relationship between the two pipe members may be restricted by the spacer.

In the foregoing embodiments, a configuration in which the insulating layer and the sheathing member are constituted by separate members is taken as an example; however, the corrugated tube may also serve as both the insulating layer and the sheathing member.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

LIST OF REFERENCE NUMERALS 10, 110, 310, 410 Conductive member
20, 120, 320, 420 Pipe member (tube-shaped conductor)
25 Heat-shrinkable tube (insulating layer)
31 Core wire (flexible conductor)
31A End portion of core wire (end portion of flexible conductor)
42 Connector terminal (terminal)
45 Braided wire (shielding member)
50 Corrugated tube (sheathing member)
121 Tube-shaped portion
130 Coated wire (coupling member)

The invention claimed is:

1. A conductive member to be routed in a vehicle, the conductive member comprising:
    at least one tube-shaped conductor being tubular in shape and having at least one bending point, the tube-shaped conductor is capable of keeping a shape;
    a flexible conductor connected to an end portion of the tube-shaped conductor and having flexibility, the tube-shaped conductor is longer in length than the flexible conductor;
    a terminal connected to an end portion of the flexible conductor on a side that is opposite to the tube-shaped conductor; and
    a sheathing member covering the tube-shaped conductor and the flexible conductor and having flexibility.

2. The conductive member according to claim 1,
    wherein the tube-shaped conductor includes a plurality of tube-shaped portions, and
    the conductive member comprises a coupling member having flexibility and conductivity and coupling the plurality of tube-shaped portions.

3. The conductive member according to claim 1,
    wherein an end portion of the flexible conductor on the tube-shaped conductor side is inserted into the tube-shaped conductor.

4. The conductive member according to claim 1, the conductive member comprising:
    a plurality of the tube-shaped conductors;
    a shielding member covering at least the plurality of tube-shaped conductors and having flexibility; and an insulating layer interposed between the plurality of tube-shaped conductors and the shielding member.

* * * * *